United States Patent
Yatskov

(10) Patent No.: US 10,304,755 B1
(45) Date of Patent: May 28, 2019

(54) APPARATUS, SYSTEM, AND METHOD FOR MITIGATING ELECTROMAGNETIC RADIATION LEAKS IN DOUBLE-DECKER HEATSINKS

(71) Applicant: Juniper Networks, Inc., Sunnyvale, CA (US)

(72) Inventor: Alexander I. Yatskov, Manteca (CA)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 15/937,781

(22) Filed: Mar. 27, 2018

(51) Int. Cl.
| | |
|---|---|
| *H01L 21/48* | (2006.01) |
| *H01L 23/40* | (2006.01) |
| *H01L 23/552* | (2006.01) |
| *H01L 23/00* | (2006.01) |
| *H01L 25/18* | (2006.01) |

(52) U.S. Cl.
CPC ...... *H01L 23/4006* (2013.01); *H01L 21/4882* (2013.01); *H01L 23/552* (2013.01); *H01L 23/562* (2013.01); *H01L 25/18* (2013.01); *H01L 2023/405* (2013.01); *H01L 2023/4031* (2013.01); *H01L 2023/4056* (2013.01); *H01L 2023/4081* (2013.01); *H01L 2023/4087* (2013.01)

(58) Field of Classification Search
CPC . H01L 23/4006; H01L 21/4882; H01L 25/18; H01L 23/562; H01L 23/552; H01L 2023/4087; H01L 2023/4056; H01L 2023/405; H01L 2023/4081; H01L 2023/4031
See application file for complete search history.

(56) References Cited

U.S. PATENT DOCUMENTS

2009/0223647 A1* 9/2009 Alousi ............... F28D 15/0233
165/80.3

OTHER PUBLICATIONS

Yatskov et al.; Apparatus, System, and Method for Cooling Devices Containing Multiple Components ;U.S. Appl. No. 15/854,840, filed Dec. 27, 2017.
Yatskov et al.; Lid for Semiconductor Electronic Package; U.S. Appl. No. 15/848,627, filed Dec. 20, 2017.
Yatskov et al.; Lid for Semiconductor Electronic Package; U.S. Appl. No. 62/476,502, filed Mar. 24, 2017.
Mikjaniec et al. ; Apparatus, System, and Method for Improved Heat Spreading in Heatsinks ; U.S. Appl. No. 15/432,195, filed Feb. 14, 2017.
Lucas; Apparatus, System, and Method for Improving the Thermal Conduction of Heat Sinks; U.S. Appl. No. 15/681,333, filed Aug. 18, 2018.

* cited by examiner

*Primary Examiner* — David Vu
(74) *Attorney, Agent, or Firm* — FisherBroyles, LLP

(57) ABSTRACT

The disclosed apparatus may include (1) a first heatsink that is coupled to a first component of a multichip module, (2) a second heatsink that is (A) coupled to a second component of the multichip module and (B) physically separated from the first heatsink by at least a certain amount of clearance, and (3) a coil spring that (A) encompasses the second heatsink, (B) resides within the certain amount of clearance that separates the first and second heatsinks from one another, and (C) prevents at least some electromagnetic radiation from leaking via the certain amount of clearance that separates the first and second heatsinks from one another. Various other apparatuses, systems, and methods are also disclosed.

20 Claims, 10 Drawing Sheets

APPARATUS, SYSTEM, AND METHOD FOR MITIGATING ELECTROMAGNETIC RADIATION LEAKS IN DOUBLE-DECKER HEATSINKS

Heatsinks are often a critical component of electronic and mechanical devices. For example, a telecommunications device may include a integrated circuit that generates heat during operation, thereby causing the operating temperature of the integrated circuit to rise. If the operating temperature rises above a certain level, the integrated circuit may overheat, malfunction, or even break. To prevent such issues, many devices may be equipped with heatsinks designed to transfer and/or dissipate heat. These heatsinks may include thermally conductive material that transfers heat away from the devices, thereby cooling the devices and/or enabling them to achieve higher performance.

The operating temperature of a device often correlates to the amount of power dissipated by that device. As technological advancements increase the amount of power certain devices (such as application-specific integrated circuits and/or high-bandwidth memory devices) are able to dissipate, such devices may need and/or call for more efficient and/or effective heatsinks. This problem may be exacerbated and/or compounded in devices that contain multiple components. For example, a multichip module that contains two distinct integrated circuits may generate more heat than a simpler device containing a single integrated circuit.

Moreover, the different circuits on a multichip module may have different cooling needs. For example, a multichip module may contain both an Application-Specific Integrated Circuit (ASIC) and a High-Bandwidth Memory (HBM) device. In this example, the HBM device may be designed to operate at a lower temperature than the ASIC. Traditional heatsink technologies may attempt to lower the operating temperature of both components to the temperature required by the HBM device. Unfortunately, such attempts may be difficult, expensive, and/or simply unsuccessful. For example, a heatsink capable of cooling one device component to a temperature far below its typical operating temperature may necessitate a prohibitively large amount of space and/or cost.

However, a recent development in heatsink technology may involve combining and/or applying multiple heatsinks to a multichip module. Such heatsink technology may incorporate multiple heatsinks into a single heat-dissipating mechanism that independently and/or individually cools separate components of the multichip module, thereby enabling the components to operate at different temperatures. This mechanism may be referred to as a "double-decker" heatsink.

Unfortunately, this double-decker heatsink technology may still have a couple deficiencies capable of negatively impacting the performance of the separate components of the multichip module and/or other nearby devices. For example, a double-decker heatsink may form and/or include gaps that enable electromagnetic radiation to enter and/or escape the corresponding multichip module. Additionally or alternatively, a double-decker heatsink may be unable to sufficiently compensate for manufacturing tolerance variation and/or warpage of the multichip module, thereby potentially leading to misalignment of the multiple heatsinks and/or unexpected thermal bridges.

The instant disclosure, therefore, identifies and addresses a need for additional and improved apparatuses, systems, and methods for mitigating electromagnetic radiation leaks in double-decker heatsinks.

SUMMARY

As will be described in greater detail below, the instant disclosure generally relates to apparatuses, systems, and methods for mitigating electromagnetic radiation leaks in double-decker heatsinks. In one example, an apparatus for accomplishing such a task may include (1) a first heatsink that is coupled to a first component of a multichip module, (2) a second heatsink that is (A) coupled to a second component of the multichip module and (B) physically separated from the first heatsink by at least a certain amount of clearance, and (3) a coil spring that (A) encompasses the second heatsink, (B) resides within the certain amount of clearance that separates the first and second heatsinks from one another, and (C) prevents at least some electromagnetic radiation from leaking via the certain amount of clearance that separates the first and second heatsinks from one another.

Similarly, a system incorporating the above-described apparatus may include (1) a multichip module comprising (A) a first component designed to operate at temperatures below a first threshold temperature and (B) a second component designed to operate at temperatures below a second threshold temperature that is different than the first threshold temperature, (2) a first heatsink that is coupled to the first component of the multichip module, (3) a second heatsink that is (A) coupled to the second component of the multichip module and (B) physically separated from the first heatsink by at least a certain amount of clearance, and (4) a coil spring that (A) encompasses the second heatsink, (B) resides within the certain amount of clearance that separates the first and second heatsinks from one another, and (C) prevents at least some electromagnetic radiation from leaking via the certain amount of clearance that separates the first and second heatsinks from one another.

A corresponding method may include (1) coupling a first heatsink to a first component of a multichip module, (2) coupling a second heatsink to a second component of the multichip module such that the first and second heatsinks are physically separated from one another by at least a certain amount of clearance, (3) encompassing the second heatsink with a coil spring such that the coil spring (A) resides within the certain amount of clearance that separates the first and second heatsinks from one another and (B) prevents at least some electromagnetic radiation from leaking via the certain amount of clearance that separates the first and second heatsinks from one another.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
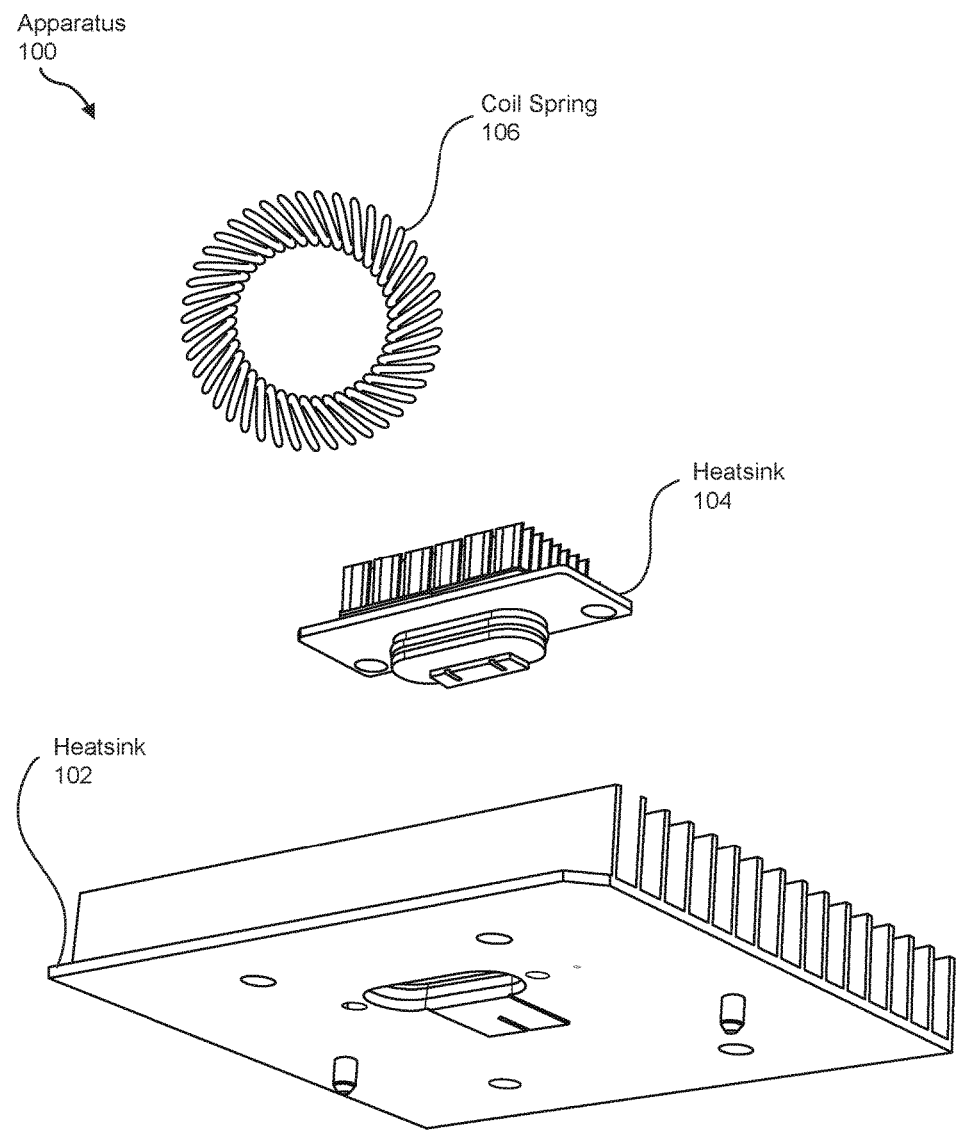
FIG. 1 is an illustration of an exemplary apparatus for mitigating electromagnetic radiation leaks in double-decker heatsinks.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for mitigating electromagnetic radiation leaks in double-decker heatsinks. In some examples, individual heatsink pieces within a double-decker heatsink may be separated from each other by a certain distance, gap, and/or clearance to prevent and/or minimize thermal crosstalk. Such distance, gap, and/or clearance may enable different components on a multichip module to operate at different temperatures. Furthermore, these heatsink pieces may be independently mounted to the different components of the multichip module via separate spring systems designed to ensure proper physical and/or thermal contact. By doing so, these heatsink pieces may enable the different components of the multichip module to safely and efficiently operate at their respective ideal temperatures.

As will be explained in greater detail below, embodiments of the instant disclosure may reject ElectroMagnetic Interference (EMI) leaks at gaps that exist and/or form between the individual heatsink pieces of a double-decker heatsink. By doing so, these embodiments may improve the performance of the multichip module to which the double-decker heatsink is mounted. These embodiments may also improve the performance of other nearby electric and/or computing components that are susceptible to EMI disturbances and/or degradation.

Additionally or alternatively, embodiments of the instant disclosure may center and/or align the individual heatsink pieces of a double-decker heatsink with respect to one another. By doing so, these embodiments may be able to compensate for manufacturing tolerance variation and/or warpage of the corresponding multichip module, thereby facilitating the appropriate load balance and/or thermal-joint distribution across the components of the multichip module despite such tolerance variation and/or warpage. These embodiments may also decrease the risk of unexpected thermal bridges and/or contact across the individual heatsink pieces of the double-decker heatsink.

The following will provide, with reference to FIGS. 1-9, detailed descriptions of exemplary apparatuses, systems, and/or implementations that facilitate mitigating electromagnetic radiation leaks in double-decker heatsinks. Finally, the discussion corresponding to FIG. 10 will provide a detailed description of an exemplary method for mitigating electromagnetic radiation leaks in double-decker heatsinks.

FIG. 1 illustrates an exemplary apparatus 100 for mitigating electromagnetic radiation leaks in double-decker heatsinks. As illustrated in FIG. 1, exemplary apparatus 100 may include and/or represent a heatsink 102, a heatsink 104, and a coil spring 106. Heatsinks 102 and 104 each generally represent any type or form of device, structure, and/or mechanism designed to conduct, transfer, absorb, and/or sink heat. Heatsinks 102 and 104 may include and/or contain a variety of thermally conductive materials. Examples of such thermally conductive materials include, without limitation, copper, aluminum, diamond, alloys of one or more of the same, combinations or variations of one or more of the same, and/or any other suitable materials.

In some examples, heatsinks 102 and 104 may contain and/or be composed of a series of ridges or corrugations extending from a base. For example, heatsinks 102 and 104 may include and/or incorporate a finned and/or pin fin configuration or design. This configuration may increase the surface area of the conductive material within the heatsink, thereby increasing the amount of heat dissipated by the same. Heatsinks 102 and 104 may also include any additional or alternative structure designed to facilitate and/or increase heat dissipation, such as wicks and/or vapor chambers.

Coil spring 106 generally represents any type or form of mechanical apparatus and/or device capable of storing, absorbing, and/or releasing energy or force by way of one or more coils. In one example, coil spring 106 may include and/or represent a canted garter spring that forms a circular shape and is connected at both ends. In this example, the canted garter spring may include and/or form various canted coils that exhibit and/or provide a uniform load and/or a flat load curve across the working deflection. When compressed, the coils of the canted garter spring may lay over and/or down to one side. The canted garter spring may exhibit and/or provide tolerance variation forgiveness. As a result, the canted garter spring may be readily adaptable to deviations from flatness. Additional examples of coil spring 106 include, without limitation, compression springs, tension springs, extension springs, torsion springs, constant-force springs, combinations or variations of one or more of the same, and/or any other suitable spring.

Coil spring 106 may be of various shapes and/or dimensions. In some examples, the canted coils of spring 106 may have an elliptical cross section. In other examples, the coils of spring 106 may have a circular cross section. In some examples, coil spring 106 may be sized in a particular way to fit around a base of heatsink 104. For example, coil spring 106 may be formed in an elliptical shape that fits around a base of heatsink 104. In one example, coil spring 106 may maintain and/or be molded to an elliptical racetrack shape that corresponds to the base of heatsink 104.

Coil spring 106 may include and/or contain a variety of materials. Examples of such materials include, without limitation, metals, copper, aluminum, alloys, plastics, combinations or variations of one or more of the same, and/or any other suitable materials.

Figure 2:
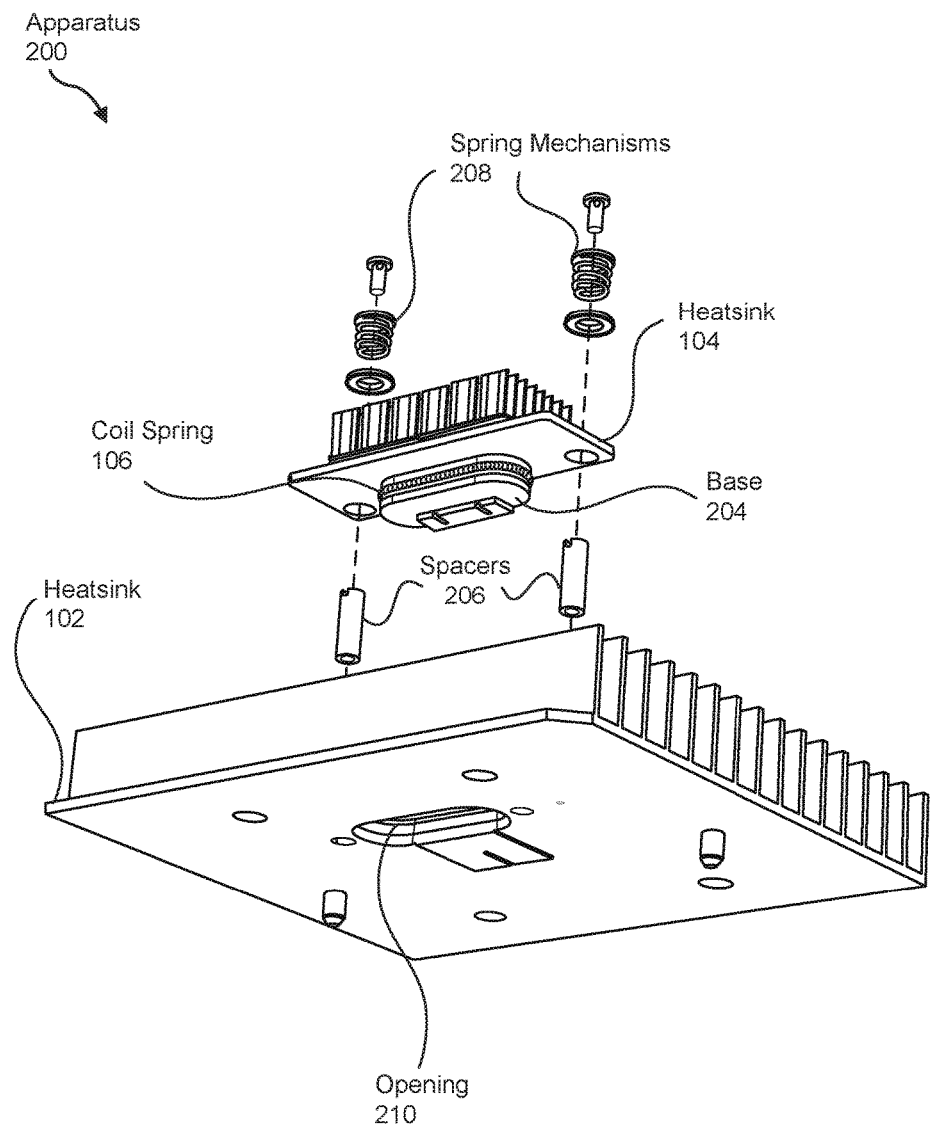
FIG. 2 is an illustration of an exemplary apparatus for mitigating electromagnetic radiation leaks in double-decker heatsinks.

FIG. 2 illustrates an exemplary apparatus 200 for mitigating electromagnetic radiation leaks in double-decker heatsinks. As illustrated in FIG. 2, exemplary apparatus 200 may include and/or represent heatsink 102, heatsink 104, and coil spring 106. In this example, coil spring 106 may encompass and/or be wrapped around a base 204 of heatsink 104. In one example, base 204 of heatsink 104 may have and/or form an elliptical shape (e.g., a racetrack shape). Base 204 may include and/or form a notch and/or trench designed to accept and/or hold coil spring 106 in place. In this example, coil spring 106 may be held in place by friction and/or pressure from base 204.

As illustrated in FIG. 2, heatsink 102 may include and/or form an opening 210 that is fitted and/or sized to accept base 204 of heatsink 104. In one example, apparatus 200 may also include spacers 206 and/or spring mechanisms 208 that facilitate securing heatsinks 102 and 104 together to form a double-decker mechanism and/or mounting that double-decker mechanism on a multichip module (not illustrated in FIG. 2). For example, each of heatsinks 102 and 104 may be coupled to a multichip module via one or more of spring mechanisms 208. In this example, spring mechanisms 208 may each include a variety of components or devices, such as a spring (e.g., a coil spring, extension spring, or any other suitable type of spring), a screw or bolt, an O-ring, a washer, and/or any other type of support or fastener.

In the example of FIG. 2, spring mechanisms 208 may be inserted into holes or openings within heatsink 102 and corresponding holes or openings within a platform of the multichip module. When spring mechanisms 208 are secured within these holes, spring mechanisms 208 may ensure that heatsink 102 makes physical contact with a corresponding component of the multichip module. For example, spring mechanisms 208 may press heatsink 102 against all or a portion of the corresponding component with enough force to facilitate sufficient and/or maximum heat conduction and/or transfer between that component and heatsink 102. In one example, the stiffness (e.g., spring constant value) of the springs within spring mechanisms 208 may be selected at least in part to enable spring mechanisms 208 to provide this amount of force.

Similarly, one or more of spring mechanisms 208 may secure at least a portion of heatsink 104 against all or a portion of a corresponding component of the multichip module. In one example, spring mechanisms 208 may be coupled to the platform of the multichip module to support heatsink 104. In this way, spring mechanisms 208 may facilitate physical contact between at least a portion of heatsink 104 and the corresponding component of the multichip module. For example, as explained above, the bottom surface of heatsink 104 may be exposed via opening 210 within heatsink 102. Securing heatsink 104 within this opening (e.g., via spring mechanisms 208) may facilitate heat transfer between the corresponding component of multichip module and heatsink 104. In one example, the spring constant value of spring mechanisms 208 may be selected at least in part to facilitate sufficient physical contact and/or heat transfer between the corresponding component and heatsink 104.

In some examples, and as will be described in greater detail below, heatsink 102 may be coupled to a first component of a multichip module. In these examples, heatsink 104 may be coupled to a second component of the multichip module. Heatsink 104 may be physically separated from heatsink 102 by at least a certain amount of clearance and/or space. In such examples, coil spring 106 may encompass base 204 of heatsink 104 and/or reside within the clearance that separates heatsinks 102 and 104 from one another. Additionally or alternatively, coil spring 106 may prevent at least some electromagnetic radiation from leaking via the clearance and/or that separates the heatsinks 102 and 104 from one another.

In some examples, coil spring 106 may enable heatsink 104 to move relative to heatsink 102. For example, coil spring 106 may serve to center and/or align heatsink 104 with heatsink 102. By doing so, coil spring 106 may effectively compensate for manufacturing tolerance variation and/or warpage of the corresponding multichip module to which heatsinks 102 and 104 are mounted and/or thermally coupled. Accordingly, coil spring 106 may facilitate the appropriate load balance and/or thermal-joint distribution across the individual components of the multichip module despite such tolerance variation and/or warpage. Centering and/or aligning heatsink 104 with heatsink 102 may also decrease the risk of unexpected thermal bridges and/or contact across heatsink 104 and heatsink 102.

Figure 3:
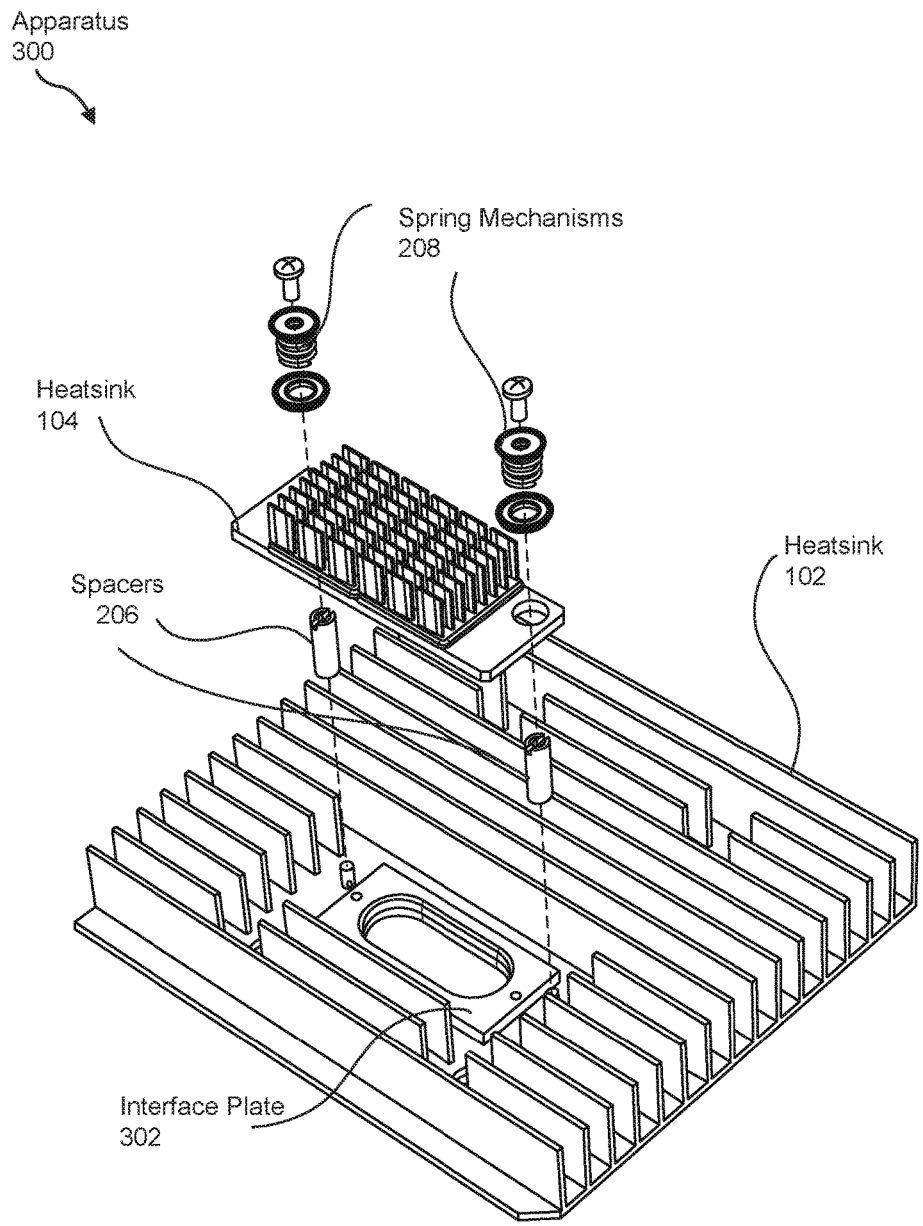
FIG. 3 is illustration of an exemplary apparatus for mitigating electromagnetic radiation leaks in double-decker heatsinks.

FIG. 3 illustrates an exemplary apparatus 300 for mitigating electromagnetic radiation leaks in double-decker heatsinks. As illustrated in FIG. 3, exemplary apparatus 300 may include and/or represent heatsink 102, heatsink 104, and coil spring 106 (not explicitly visible in FIG. 3). Although not visible in FIG. 3, coil spring 106 may encompass and/or be wrapped around a base 204 of heatsink 104 (much like in apparatus 200 in FIG. 2). In one example, apparatus 300 may also include spacers 206 and/or spring mechanisms 208 that facilitate securing heatsinks 102 and 104 together to form a double-decker mechanism and/or mounting that double-decker mechanism on a multichip module (not illustrated in FIG. 3).

As illustrated in FIG. 3, exemplary apparatus 300 may further include an interface plate 302. In some examples, interface plate 302 may serve as an interface between heatsink 102 and heatsink 104. In these examples, heatsink 104 may be coupled to heatsink 102 via and/or at interface plate 302. In one example, interface plate 302 may include and/or contain copper and/or any other thermally conductive material. Additionally or alternatively, interface plate 302 may include and/or represent a Thermal Interface Material (TIM).

Although not visible in FIG. 3, coil spring 106 may encompass and/or be wrapped around a base 204 of heatsink 104 (much like in apparatus 200 in FIG. 2). In one example, apparatus 300 may also include spacers 206 and/or spring mechanisms 208 that facilitate securing heatsinks 102 and 104 together to form a double-decker mechanism and/or mounting that double-decker mechanism to a multichip module (not illustrated in FIG. 3).

Figure 4:
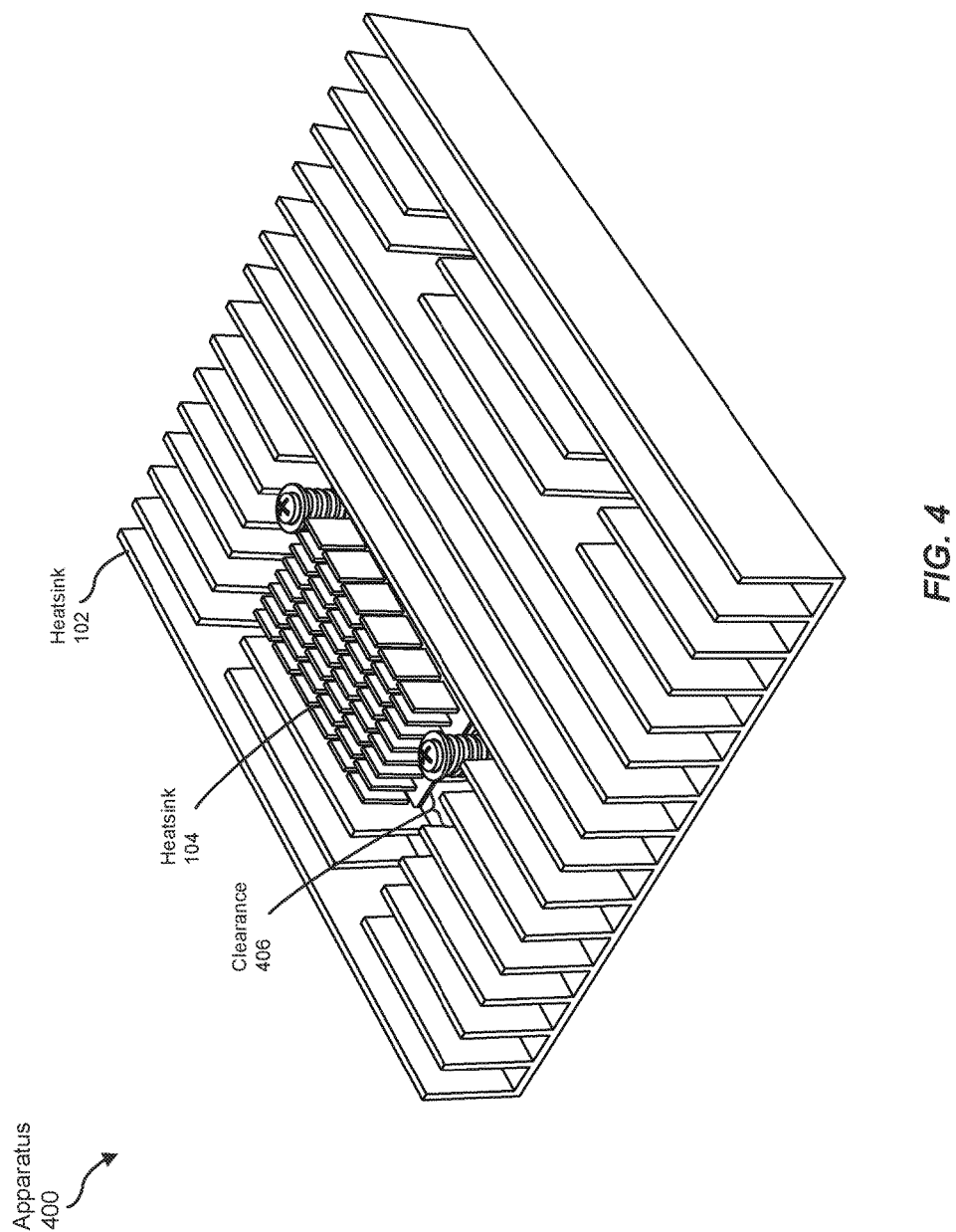
FIG. 4 is an illustration of an exemplary apparatus for mitigating electromagnetic radiation leaks in double-decker heatsinks.

FIG. 4 illustrates an exemplary apparatus 400 for mitigating electromagnetic radiation leaks in double-decker heatsinks. As illustrated in FIG. 4, exemplary apparatus 400 may include and/or represent heatsink 102 and heatsink 104 that collectively form a double-decker heatsink. In one example, apparatus 400 in FIG. 4 may represent the double-decker heatsink as constructed and/or assembled for mounting and/or applying to the multichip module. In this example, apparatus 400 in FIG. 4 shows and/or illustrates a clearance 406 between heatsink 102 and heatsink 104. Clearance 406 may amount to and/or represent space and/or an air gap between heatsink 102 and heatsink 104.

In some examples, clearance 406 may be affected, altered, and/or reduced by the introduction of coil spring 106 as applied to base 204 of heatsink 104. In one example, clearance 406 and/or coil spring 106 may effectively define a frequency range of EMI for rejection. For example, without coil spring 106, clearance 406 may allow EMI of a certain frequency range to penetrate into and/or leak from the multichip module via the double-decker heatsink. However, coil spring 106 may modify clearance 406 such that EMI within that frequency range is no longer able to penetrate into and/or escape from the multichip module via the double-decker heatsink. Accordingly, coil spring 106 may serve as an EMI shield that rejects EMI within the frequency ranged tuned by the combination of clearance 406 and coil spring 106.

Figure 5:
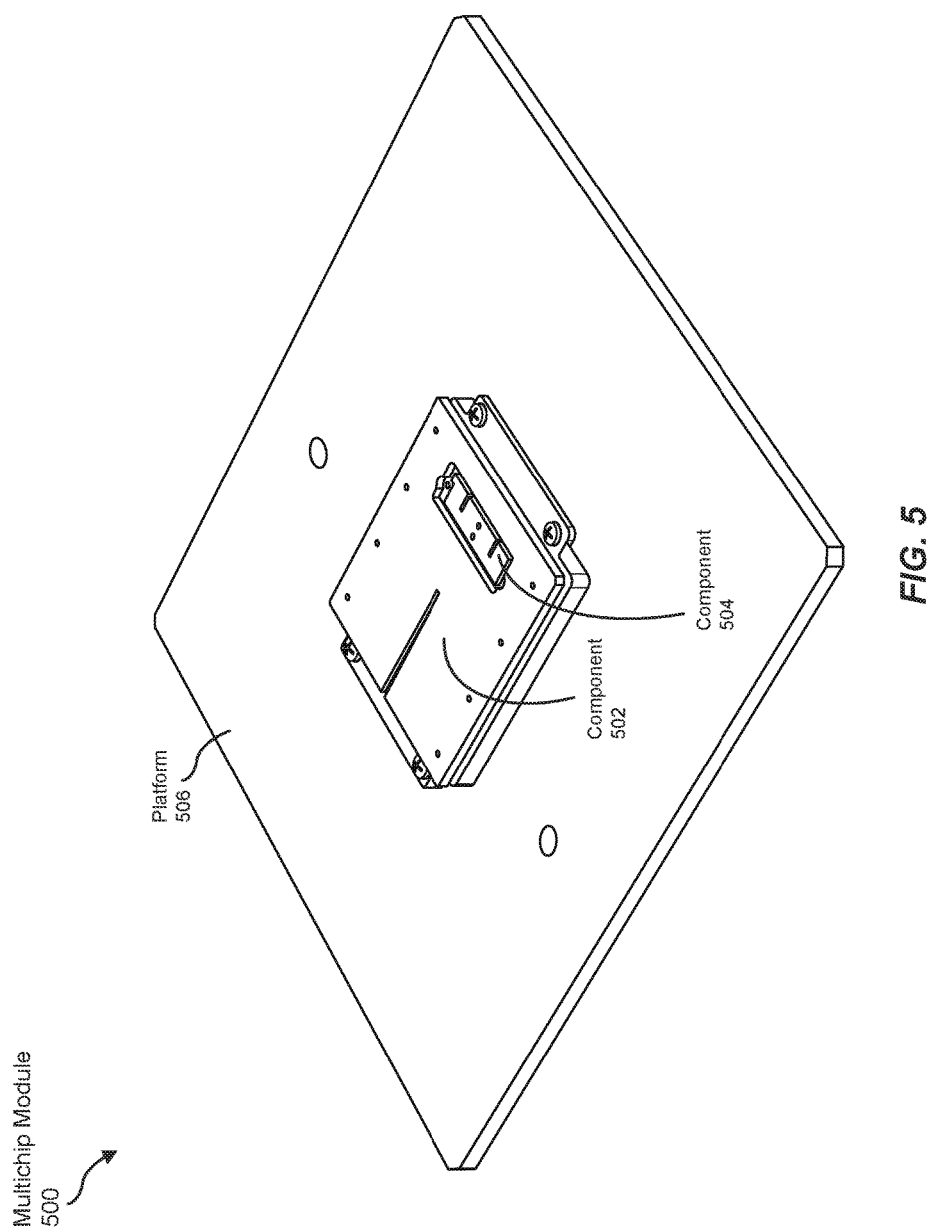
FIG. 5 is an illustration of an exemplary multichip module that is cooled by a double-decker heatsink.

FIG. 5 illustrates an exemplary multichip module 500 to which a double-decker heatsink is mounted and/or applied. Exemplary multichip module 500 generally represents any type or form of mechanical and/or electrical device containing one or more heat-generating components. In some example, multichip module 500 may include and/or represent an electronic device and/or assembly that contains at least two distinct chips, integrated circuits, and/or semiconductor dies. In one example, multichip module 500 may represent and/or be packaged as a lidless integrated circuit or device.

As illustrated in FIG. 5, multichip module 500 may include and/or incorporate component 502 and component 504. In some examples, components 502 and 504 may operate independently of each other. In other examples, components 502 and 504 may operate in conjunction with one another.

Components 502 and 504 may each be secured on a platform 506. In one example, component 502 may represent one type of semiconductor die (e.g., an ASIC), and component 504 may represent a different type of semiconductor die (e.g., an HBM chip). In general, multichip module 500 may contain any number and/or any type of distinct heat-generating components.

In some examples, components 502 and 504 may be designed to operate at or below certain operating temperatures. For example, the performance and/or reliability of one or more of components 502 and 504 may be impaired as its operating temperature rises beyond a certain threshold temperature. Because component 502 and component 504 may contain different materials and/or perform different functions, the threshold operating temperature of component 502 may differ from the threshold operating temperature of component 504. As an example, component 502 may have a threshold operating temperature of 115° C., while component 504 may have a threshold operating temperature of 95° C. To ensure proper operation of multichip module 500, the temperature of each of components 502 and 504 must be kept at or below their respective threshold temperatures.

In some examples, component 502 and component 504 may be of different heights. For example, component 502 may extend farther from platform 506 than component 504 or vice versa. This height disparity in co-planarity may be the result of manufacturing tolerances and/or the dimensions of components 502 and 504. To ensure that components 502 and 504 are pressed securely against heatsink 102 and heatsink 104, respectively, the spring constants of spring mechanisms 208 may be selected independently of one another.

In some examples, multichip module 500 may be incorporated into a telecommunications device that facilitates communication among computing devices within a network and/or across networks. Examples of such a telecommunications devices include, without limitation, routers (such as provider edge routers, hub routers, spoke routers, autonomous system boundary routers, and/or area border routers), switches, hubs, modems, bridges, repeaters, gateways, multiplexers, network adapters, network interfaces, network racks, chasses, servers, computing devices, portions of one or more of the same, combinations or variations of one or more of the same, and/or any other suitable telecommunications device.

Figure 6:
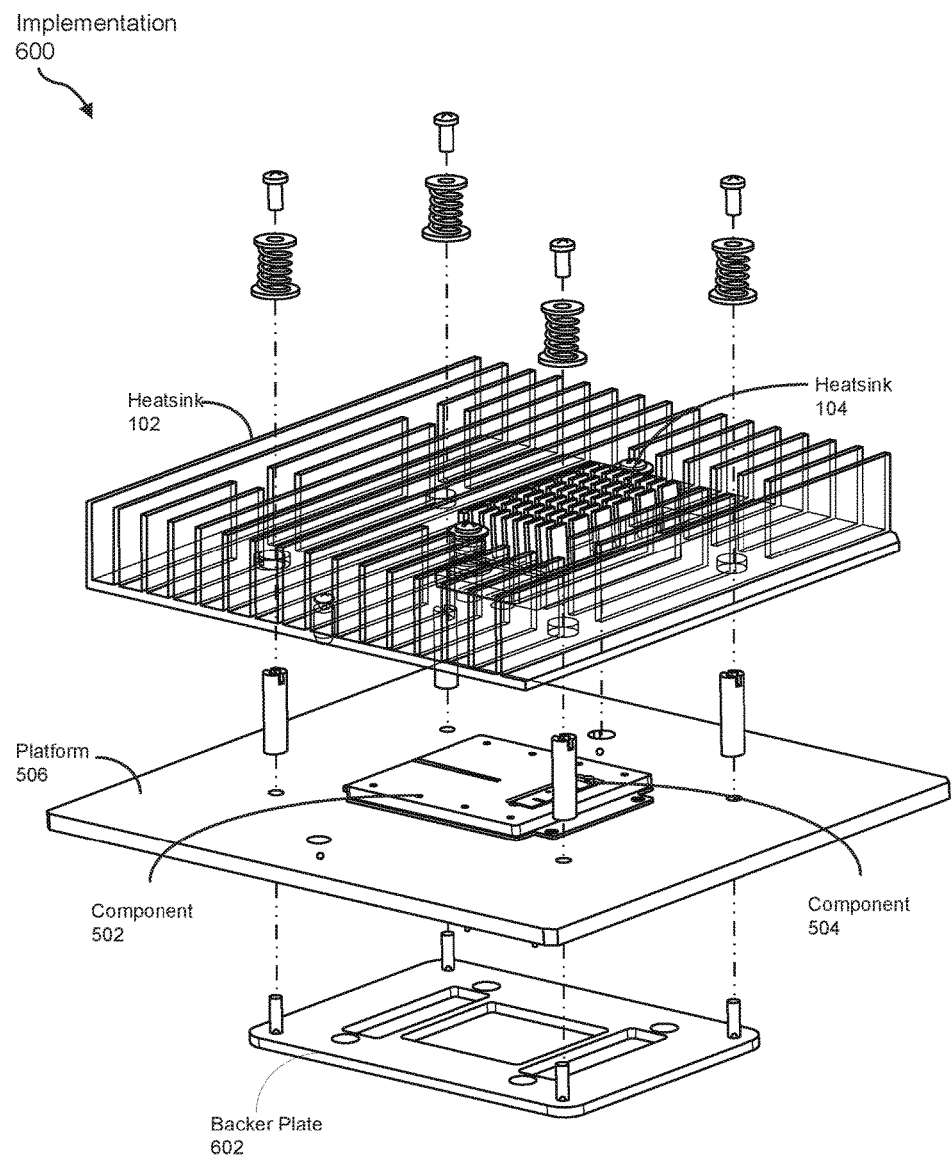
FIG. 6 is illustration of an exemplary implementation of an apparatus for mitigating electromagnetic radiation leaks in double-decker heatsinks.

FIG. 6 illustrates an expanded and/or exploded view of an exemplary implementation 600 for mitigating electromagnetic radiation leaks in double-decker heatsinks. Specifically, FIG. 6 may show and/or demonstrate how the various components of the apparatuses in FIGS. 1-4 and multichip module 500 in FIG. 5 may be arranged and/or secured relative to one another. In addition to the various components illustrated in FIGS. 1-5, FIG. 6 also shows a backer plate 602 that facilitates incorporating multichip module 500 and the double-decker heatsink into a telecommunications device. Backer plate 602 generally represents any sheet and/or fastener that couples heatsinks 102 and 104 and platform 506 to a load or other structure within a telecommunications device.

In some examples, multichip module 500 may sustain and/or experience a certain amount of warpage during manufacturing. For example, heat applied during the manufacturing of multichip module 500 may cause portions of multichip module 500 to warp in one way or another. In such examples, coil spring 106 may enable and/or cause heatsink 104 to align with heatsink 102 despite the warpage sustained and/or experienced by multichip module 500 during manufacturing. In this way, coil spring 106 may facilitate the appropriate load balance and/or thermal-joint distribution across components 502 and 504 of multichip module 500 despite such tolerance variation and/or warpage. Coil spring 106 may also enable and/or cause heatsink 104 to align with heatsink 102 without adding any extra load to multichip module 500.

As described above, coil spring 106 may serve multiple purposes within a double-decker heatsink mounted to a multichip module. For example, coil spring 106 may effectively reject and/or block EMI leaks via the clearance maintained between the individual heatsink pieces of the double-decker heatsink. In addition, coil spring 106 may effectively align the individual heatsink pieces with respect to one another at a minimal distance between the heat-generating components of the multichip module. Coil spring 106 may also protect the moving joints of the double-decker heatsink against EMI leaks and/or enable the travel distance of the moving joints to be independent of the corresponding EMI seal compression force.

Moreover, coil spring 106 may be used to conform mating heatsink pieces of various and/or different configurations. Coil spring 106 may further be able to compensate for 3-dimensional warpage sustained by the multichip module during manufacturing such that the moving joints of the double-decker heatsink do not impose any additional load on the multichip module.

Figure 7:
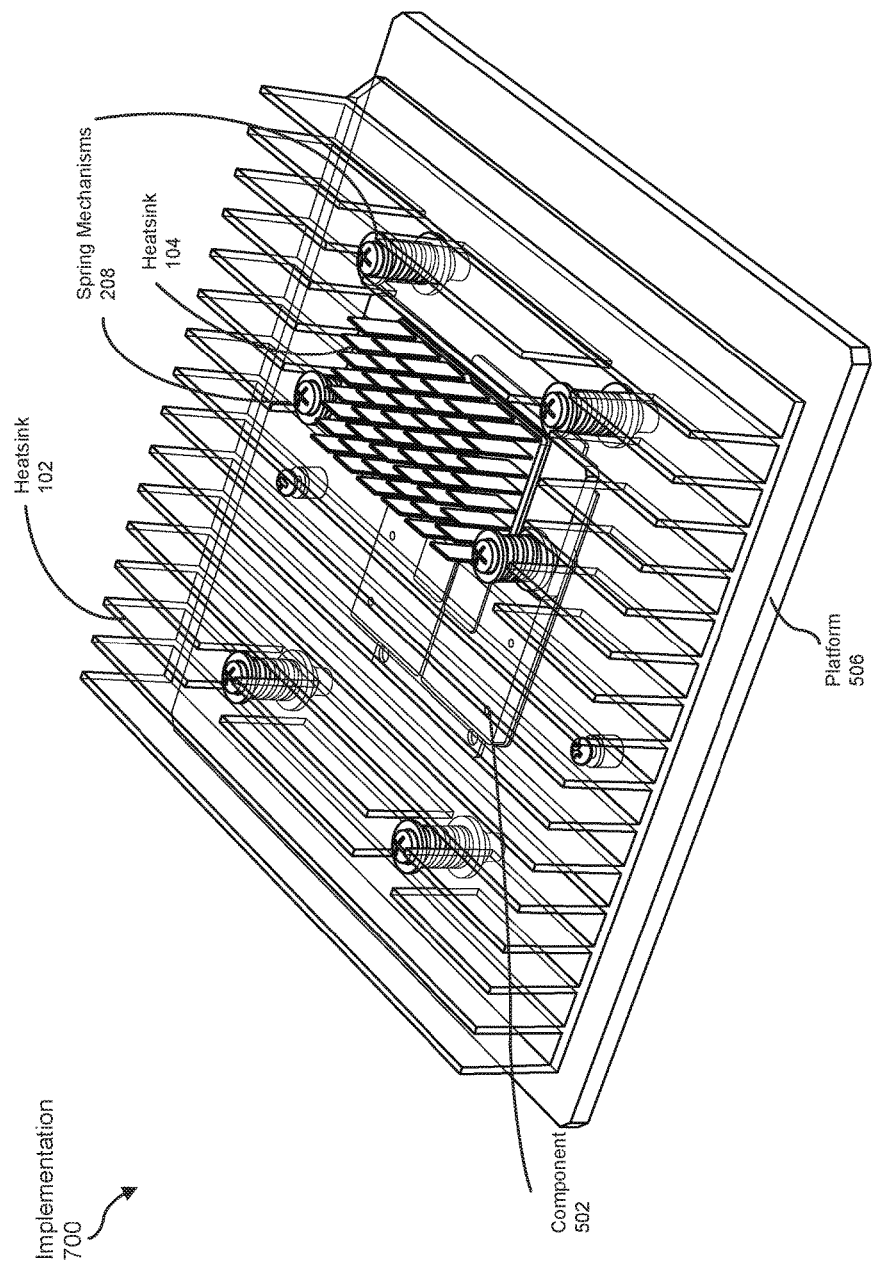
FIG. 7 is illustration of an exemplary implementation of an apparatus for mitigating electromagnetic radiation leaks in double-decker heatsinks.

FIG. 7 illustrates an exemplary implementation 700 of an apparatus for mitigating electromagnetic radiation leaks in double-decker heatsinks. As illustrated in FIG. 7, exemplary implementation 700 may include and/or involve heatsinks 102 and 104 coupled to platform 506 via spring mechanisms 208. In this example, heatsink 102 may be mounted and/or thermally coupled to component 502 of multichip module 500, and heatsink 104 may be mounted and/or thermally coupled to component 504 of multichip module 500.

In one example, heatsink 102 may transfer heat away from component 502 of multichip module 500 such that component 502 operates at a temperature below its operating temperature threshold. Similarly, heatsink 104 may transfer heat away from component 504 of multichip module 500 such that component 504 operates at a temperature below its operating temperature threshold. In this example, the operating temperature threshold of component 504 may be less than the operating temperature threshold of component 502.

Figure 8:
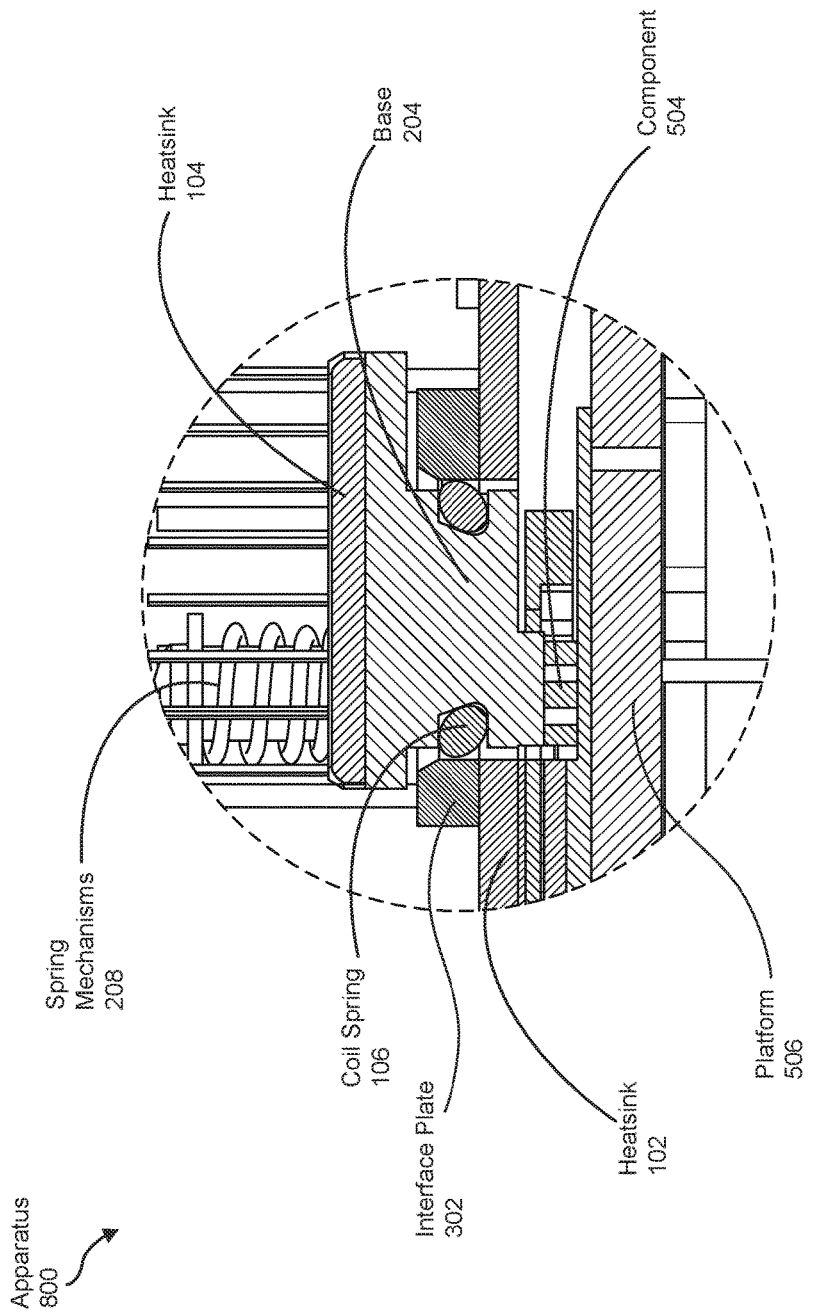
FIG. 8 is illustration of an exemplary apparatus for mitigating electromagnetic radiation leaks in double-decker heatsinks.

FIG. 8 illustrates a cross section of an exemplary apparatus 800 for mitigating electromagnetic radiation leaks in double-decker heatsinks. As illustrated in FIG. 8, exemplary apparatus 800 may include and/or represent heatsink 104 mounted to interface plate 302 by way of spring mechanisms 208. In this position, base 204 of heatsink 104 may pass through opening 210 of heatsink 102 to make physical and/or thermal contact with component 504 on platform 506. In this example, heatsink 102 may be mounted and/or thermally coupled to component 502 of multichip module 500, and heatsink 104 may be mounted and/or thermally coupled to component 504 of multichip module 500.

Figure 9:
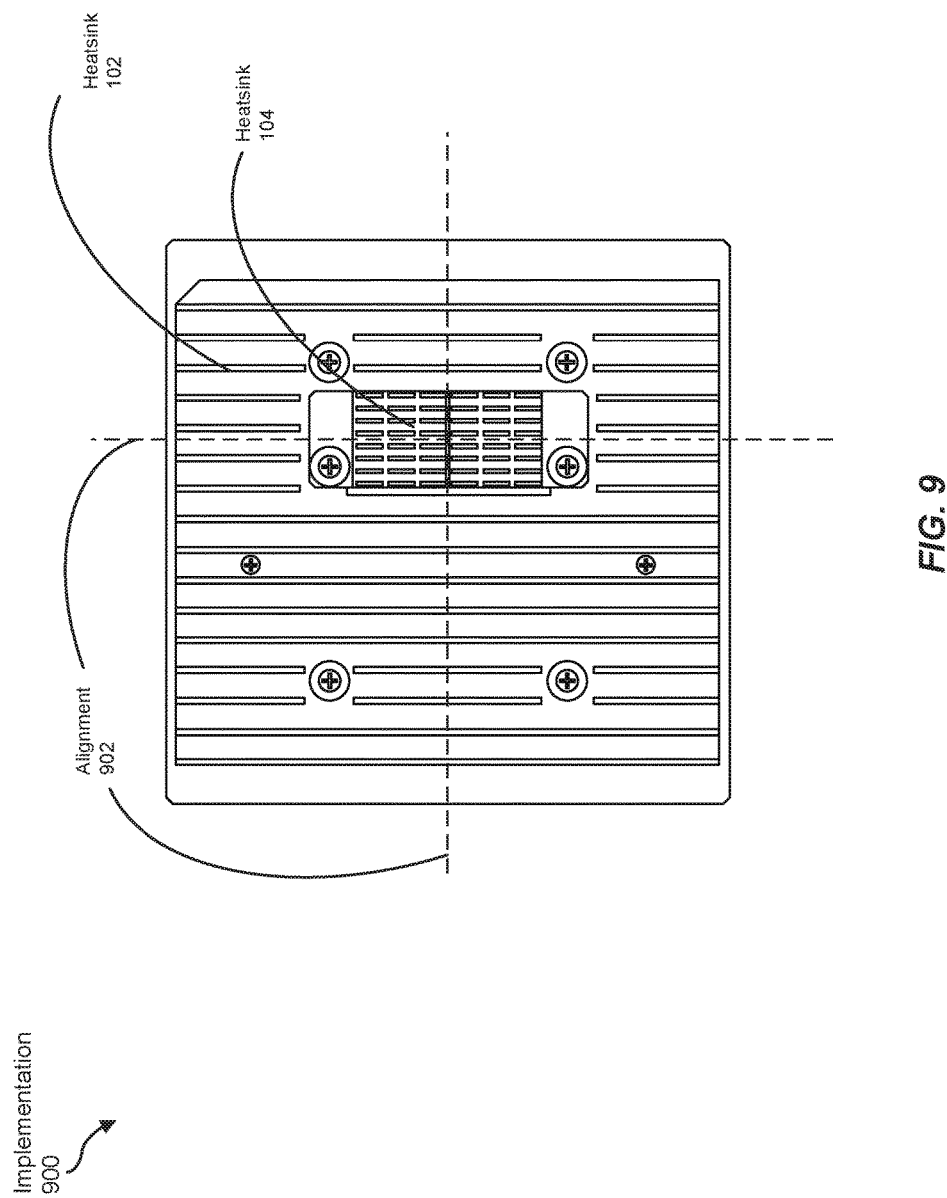
FIG. 9 is illustration of an exemplary implementation of an apparatus for mitigating electromagnetic radiation leaks in double-decker heatsinks.

FIG. 9 illustrates a top-down view of an exemplary implementation 900 for mitigating electromagnetic radiation leaks in double-decker heatsinks. As illustrated in FIG. 9, exemplary implementation 900 may include and/or involve a double-decker heatsink composed of heatsinks 102 and 104, which are mounted to components 502 and 504 (not explicitly visible in FIG. 9), respectively. In this example, coil spring 106 may serve to center and/or align heatsink 104 with heatsink 102. As a result, heatsink 104 may maintain an alignment 902 with respect to heatsink 102 despite the moving joints of the double-decker heatsink and/or any warpage sustained and/or experienced by multichip module 500 during manufacturing. In this way, coil spring 106 may facilitate the appropriate load balance and/or thermal-joint distribution across components 502 and 504 of multichip module 500 despite such moving joints, tolerance variation, and/or warpage.

Figure 10:
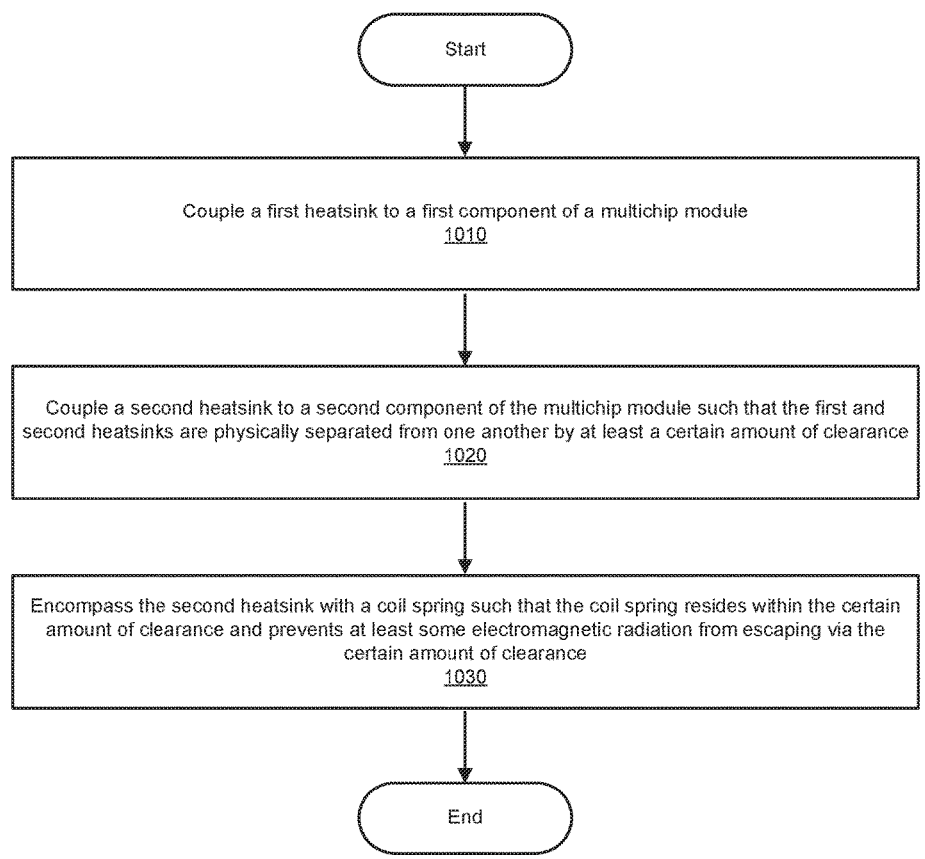
FIG. 10 is a flow diagram of an exemplary method for mitigating electromagnetic radiation leaks in double-decker heatsinks.

FIG. 10 is a flow diagram of an exemplary method 1000 for mitigating electromagnetic radiation leaks in double-decker heatsinks. Method 1000 may include the step of coupling a first heatsink to a first component of a multichip module (1010). Step 1010 may be performed in a variety of ways, including any of those described above in connection with FIGS. 1-9. For example, a computing equipment manufacturer or subcontractor may mount and/or attach heatsink 102 to component 502 of multichip module 500. In this example, multichip module 500 may run and/or be set to operate as part of a router and/or switch that forwards traffic among computing devices within a network and/or across networks. Heatsink 102 may absorb and/or sink heat generated by component 502 during operation of the router and/or switch.

Method 1000 may also include the step of coupling a second heatsink to a second component of the multichip module (1020). Step 1020 may be performed in a variety of ways, including any of those described above in connection with FIGS. 1-9. For example, the computing equipment manufacturer or subcontractor may mount and/or attach heatsink 104 to component 504 of multichip module 500. Heatsink 104 may absorb and/or sink heat generated by component 504 during operation of the router and/or switch.

Method 1000 may further include the step of encompassing the second heatsink with a coil spring such that the coil spring resides within the certain amount of clearance and prevents at least some electromagnetic radiation from escaping via the certain amount of clearance (1030). Step 1030 may be performed in a variety of ways, including any of those described above in connection with FIGS. 1-9. For example, the computing equipment manufacturer or subcontractor may wrap coil spring 106 around base 204 of heatsink 104 before installing heatsink 104 to component 504. In other words, the computing equipment manufacturer or subcontractor may apply coil spring 106 to base 204 of heatsink 104 before installing heatsink 104 to component 504.

As a result, coil spring 106 may serve to reject EMI leaks to and/or from multichip module 500 via clearance 406. Additionally or alternatively, coil spring 106 may serve to center and/or align heatsink 104 with heatsink 102 despite certain manufacturing tolerance variations and/or warpage sustained and/or experienced by multichip module 500.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:
1. An apparatus comprising:
a first heatsink that is coupled to a first component of a multichip module;
a second heatsink that is:
coupled to a second component of the multichip module; and physically separated from the first heatsink by at least a certain amount of clearance; and a coil spring that:
encompasses the second heatsink;
resides within the certain amount of clearance that separates the first and second heatsinks from one another; and
prevents at least some electromagnetic radiation from leaking via the certain amount of clearance that separates the first and second heatsinks from one another.

2. The apparatus of claim 1, wherein:
the first heatsink transfers heat away from the first component such that the first component operates at a temperature below a first threshold temperature; and
the second heatsink transfers heat away from the second component such that the second component operates at a temperature below a second threshold temperature that is different from the first threshold temperature.

3. The apparatus of claim 1, wherein the coil spring comprises a canted garter spring.

4. The apparatus of claim 1, wherein the coil spring:
enables the second heatsink to move relative to the first heatsink; and
serves to align the second heatsink with the first heatsink.

5. The apparatus of claim 1, wherein:
the multichip module sustains a certain amount of warpage due at least in part to exposure to heat; and
the coil spring enables the second heatsink to align with the first heatsink despite the certain amount of warpage sustained by the multichip module.

6. The apparatus of claim 1, wherein the coil spring enables the second heatsink to align with the first heatsink without adding any extra load to the multichip module.

7. The apparatus of claim 1, wherein:
the certain amount of clearance defines a frequency range of electromagnetic radiation for rejection;
the electromagnetic radiation falls within the frequency range defined by the certain amount of clearance; and
the coil spring rejects the electromagnetic radiation within the frequency range.

8. The apparatus of claim 1, wherein;
the second heatsink includes an elliptically shaped base; and
the coil spring is formed in an elliptical shape that fits around the elliptically shaped base of the second heatsink.

9. The apparatus of claim 8, wherein the first heatsink forms an opening that is fitted to accept the elliptically shaped base of the second heatsink; and
the elliptically shaped base of the second heatsink resides in the opening of the first heatsink.

10. The apparatus of claim 1, wherein:
the multichip module comprises a lidless integrated circuit;
the first component comprises an application specific integrated circuit incorporated into the lidless integrated circuit; and
the second component comprises a high bandwidth memory device incorporated into the lidless integrated circuit.

11. A system comprising:
a multichip module comprising:
a first component designed to operate at temperatures below a first threshold temperature; and
a second component designed to operate at temperatures below a second threshold temperature that is different than the first threshold temperature;
a first heatsink that is coupled to the first component of the multichip module;
a second heatsink that is:
coupled to the second component of the multichip module; and
physically separated from the first heatsink by at least a certain amount of clearance; and
a coil spring that:
encompasses the second heatsink;
resides within the certain amount of clearance that separates the first and second heatsinks from one another; and
prevents at least some electromagnetic radiation from leaking via the certain amount of clearance that separates the first and second heatsinks from one another.

12. The system of claim 11, wherein:
the first heatsink transfers heat away from the first component such that the first component operates at a temperature below the first threshold temperature; and
the second heatsink transfers heat away from the second component such that the second component operates at a temperature below the second threshold temperature that is different from the first threshold temperature.

13. The system of claim 11, wherein the coil spring comprises a canted garter spring.

14. The system of claim 11, wherein the coil spring:
enables the second heatsink to move relative to the first heatsink; and
serves to align the second heatsink with the first heatsink.

15. The system of claim 11, wherein:
the multichip module sustains a certain amount of warpage due at least in part to exposure to heat; and
the coil spring enables the second heatsink to align with the first heatsink despite the certain amount of warpage sustained by the multichip module.

16. The system of claim 11, wherein the coil spring enables the second heatsink to align with the first heatsink without adding any extra load to the multichip module.

17. The system of claim 11, wherein:
the certain amount of clearance defines a frequency range of electromagnetic radiation for rejection;
the electromagnetic radiation falls within the frequency range defined by the certain amount of clearance; and
the coil spring rejects the electromagnetic radiation within the frequency range.

18. The system of claim 11, wherein;
the second heatsink includes an elliptically shaped base; and
the coil spring is formed in an elliptical shape that fits around the elliptically shaped base of the second heatsink.

19. The system of claim 18, wherein the first heatsink forms an opening that is fitted to accept the elliptically shaped base of the second heatsink; and
the elliptically shaped base of the second heatsink resides in the opening of the first heatsink.

20. A method comprising:
coupling a first heatsink to a first component of a multichip module;
coupling a second heatsink to a second component of the multichip module such that the first and second heatsinks are physically separated from one another by at least a certain amount of clearance;

encompassing the second heatsink with a coil spring such that the coil spring:
   resides within the certain amount of clearance that separates the first and second heatsinks from one another; and
   prevents at least some electromagnetic radiation from leaking via the certain amount of clearance that separates the first and second heatsinks from one another.

\* \* \* \* \*